(12) United States Patent
Mostofa et al.

(10) Patent No.: US 10,672,438 B2
(45) Date of Patent: Jun. 2, 2020

(54) DYNAMIC RECONFIGURABLE DUAL POWER I/O RECEIVER

(71) Applicant: Intel Corporation, Santa Clara, CA (US)

(72) Inventors: Mohammed G. Mostofa, Portland, OR (US); Roger K. Cheng, San Jose, CA (US); Aaron Martin, El Dorado Hills, CA (US); Christopher Mozak, Portland, OR (US); Pavan Kumar Kappagantula, San Mateo, CA (US); Hsien-Pao Yang, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/147,635

(22) Filed: Sep. 29, 2018

(65) Prior Publication Data

US 2020/0105319 A1    Apr. 2, 2020

(51) Int. Cl.
| | | |
|---|---|---|
| *G11C 7/10* | (2006.01) | |
| *G06F 1/3234* | (2019.01) | |
| *G06F 13/16* | (2006.01) | |

(52) U.S. Cl.
CPC .......... *G11C 7/1087* (2013.01); *G06F 1/3275* (2013.01); *G06F 13/1694* (2013.01); *G11C 7/1051* (2013.01)

(58) Field of Classification Search
CPC ................ G11C 7/1087; G11C 7/1051; H03F 2203/45212; G06F 13/1694; G06F 1/3275; H03M 1/124; H03M 1/1023
See application file for complete search history.

(56) References Cited

U.S. PATENT DOCUMENTS

| | | | |
|---|---|---|---|
| 7,391,824 B2* | 6/2008 | Wei | H04L 25/06 375/316 |
| 2003/0099307 A1 | 5/2003 | Wu | |
| 2007/0146073 A1* | 6/2007 | Wu | H03F 3/45183 330/258 |
| 2008/0024342 A1 | 1/2008 | Deval et al. | |
| 2008/0224754 A1 | 9/2008 | Wei et al. | |
| 2015/0312060 A1 | 10/2015 | Sinha | |
| 2017/0141785 A1* | 5/2017 | Beukema | H03M 1/1023 |
| 2017/0214396 A1 | 7/2017 | Krishna | |
| 2017/0243627 A1* | 8/2017 | Mansuri | G06F 1/10 |
| 2018/0083608 A1* | 3/2018 | Cho | H03K 5/2481 |

OTHER PUBLICATIONS

International Search Report and Written Opinion from PCT/US2019/040023 notified Oct. 23, 2019, 13 pgs.

* cited by examiner

*Primary Examiner* — David Lam
(74) *Attorney, Agent, or Firm* — Green, Howard, & Mughal LLP

(57) ABSTRACT

An apparatus is provided which comprises: a first circuitry to sample a first input signal to generate a first sampled signal, and to sample a second input signal to generate a second sampled signal, wherein the first input signal comprises data; a second circuitry to receive the first sampled signal and the second sampled signal, and to generate a first pair of differential signals; an offset cancellation circuitry to cancel or reduce an offset in the first pair of differential signals; and a latch to receive the first pair of differential signals subsequent to the cancellation or reduction of the offset, and to output a second pair of differential signals, wherein the second pair of differential signals is indicative of the data.

20 Claims, 12 Drawing Sheets

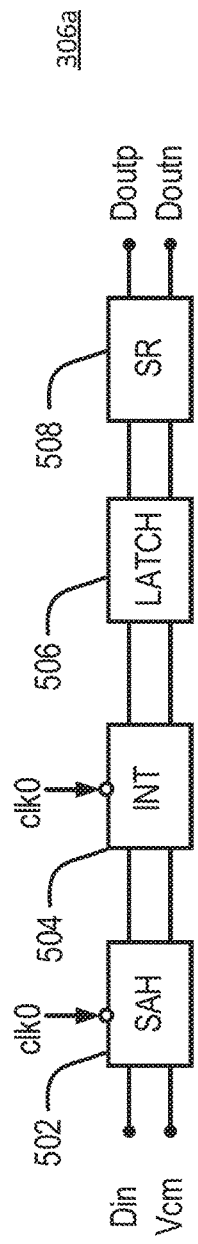
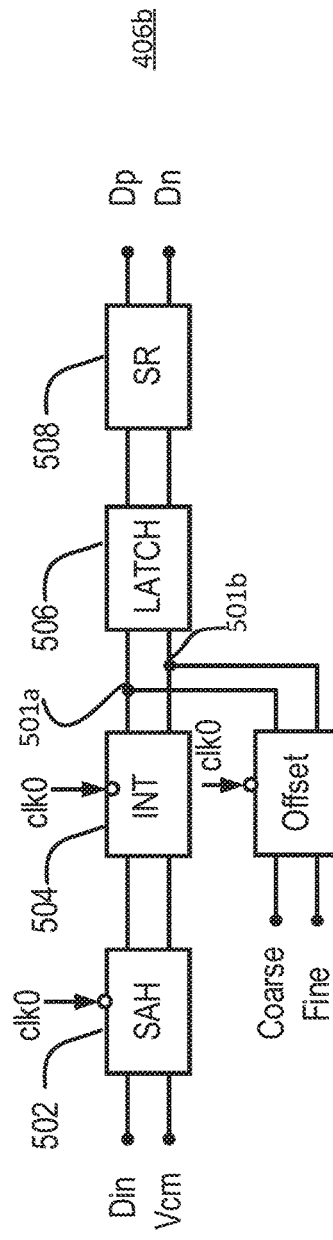
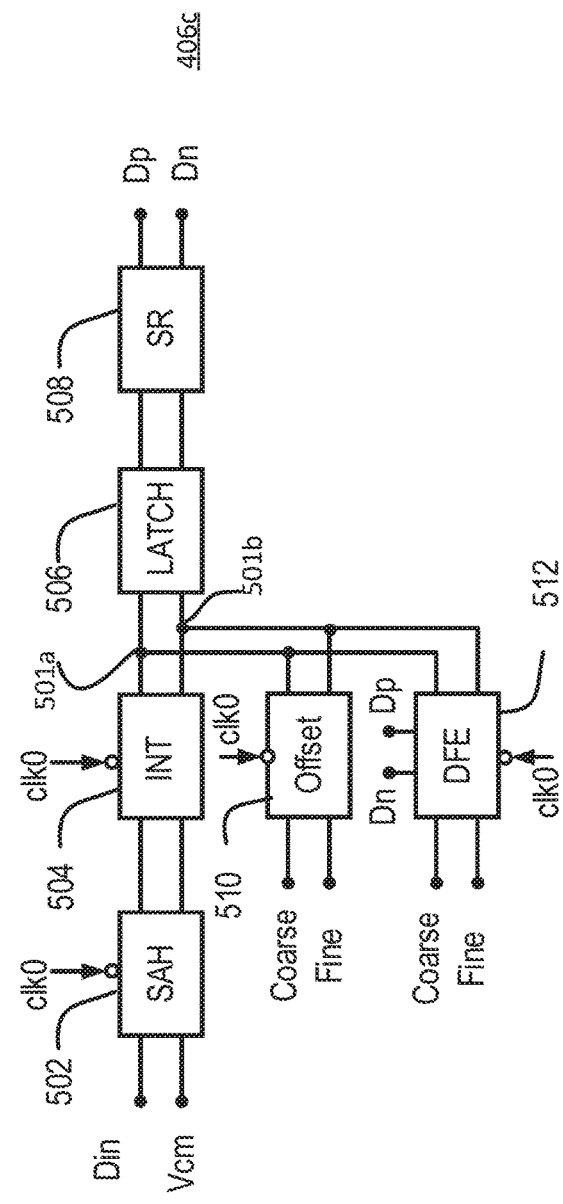
Fig. 5A
Fig. 5B
Fig. 5C

DYNAMIC RECONFIGURABLE DUAL POWER I/O RECEIVER

BACKGROUND

Next generation memory such as Double Data Rate (DDR) technologies (e.g. LP4x, DDR5, LP5, etc.) have been purposed for lower area and lower power. Current DDRx (where, 'x' is a number) matched receiver (RX) architecture is analog intensive with circuits that rely on bias currents, which are difficult for power management. Also, this RX architecture does not scale well, as it is power and area hungry.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 5A-5C illustrate a schematic of RX Core configurations, according to some embodiments.

DETAILED DESCRIPTION

Figure 1:
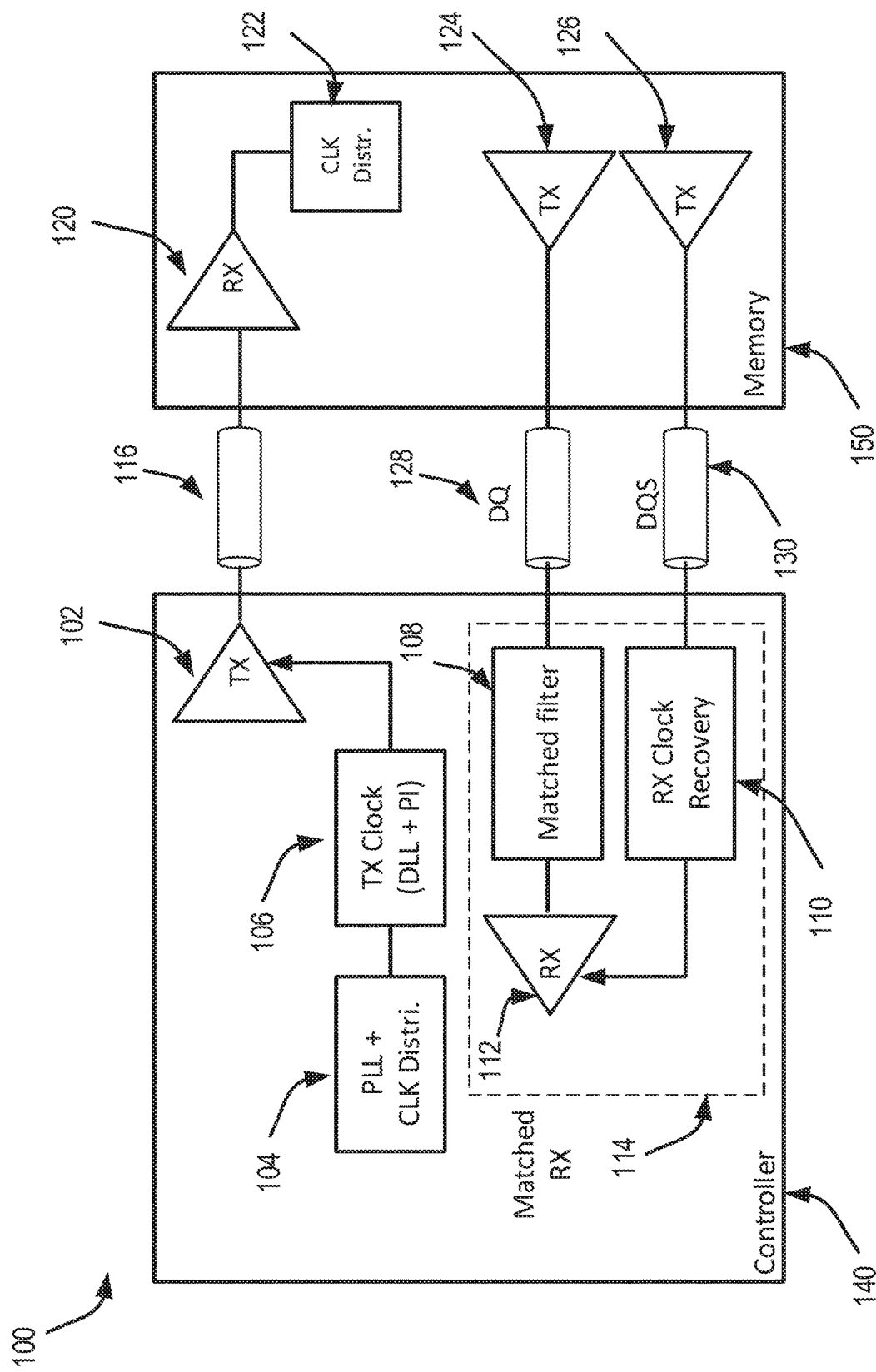
FIG. 1 illustrates a schematic of a Memory/Controller interface.

Here is the list of abbreviations for various terms in the description and figures. DDR: Double Data Rate; LPDDR: Low Power Double Data Rate; DCC: Duty Cycle Correction; DCD: Duty Cycle Distortion; DLL: Delay Locked Loop; PI: Phase Interpolator; TX: Transmitter; RX: Receiver; DFE: Decision Feedback Equalizer; Din: Input data; Vcm: internal common mode; Clk0, Clk180: half rate clocks separated by 180 degree phases; SAH: Sample and hold; INT: Integrator; SR: Set/Reset Latch; DFF: D flip-flop; MOS: Metal Oxide Semiconductor; PMOS: P-type Metal Oxide Semiconductor; NMOS: n-type MOS; and MUX: Multiplexer.

The current xDDR matched receiver architecture is analog intensive with bias currents which are difficult for power management. Also, this architecture does not scale well as it is power and area hungry. Further, implementing decision feedback equalizer (DFE) into this architecture to compensate for channel loss to enable higher data rates is challenging. Embodiments of the disclosure include a fully dynamic reconfigurable sampled dual power receiver with 3 to 4 times smaller power consumption for low power memory applications (e.g., with merely leakage power when the clock is off). Embodiments of disclosure include a sampled receiver latch in a single-ended memory interface for sampling both signal and reference voltage with a DFE. This architecture provides a scalable solution for next generation xDDR (e.g. xDDR5) data rates. Furthermore, the dynamic architecture, with no bias currents, provides a simple power management solution by switching off the receiver clock to power down the entire receiver. Other technical effects will be evident with reference to various figures and embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The term "device" may generally refer to an apparatus according to the context of the usage of that term. For example, a device may refer to a stack of layers or structures, a single structure or layer, a connection of various structures having active and/or passive elements, etc. Generally, a device is a three dimensional structure with a plane along the x-y direction and a height along the z direction of an x-y-z Cartesian coordinate system. The plane of the device may also be the plane of an apparatus which comprises the device.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

The terms "left," "right," "front," "back," "top", and "bottom" and the like in the description and in the claims, if any, are used for descriptive purposes and not necessarily for describing permanent relative positions.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "between" may be employed in the context of the z-axis, x-axis or y-axis of a device. A material that is between two other materials may be in contact with one or both of those materials, or it may be separated from both of the other two materials by one or more intervening materials. A material that is between two other materials may be in contact with one or both of those materials, or it may be separated from both of the other two materials by one or more intervening materials, either temporally, spatially, in ranking or connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 illustrates a schematic of a Memory/Controller interface 100. The Controller interface 140 comprises a transmitter block, which includes: a Phase Locked Loop (PLL) and Clock Distribution circuitry 104; a transmitter (TX) clock circuitry 106 which comprises a Delay Locked Loop (DLL) and Phase Interpolator (PI); and a Transmit circuitry (also referred to as a Transmitter)102. The controller interface 140 also comprises a receiver circuitry 114. FIG. 1 illustrates a Matched Receiver circuitry 114, comprising a Matched Filter 108, an Rx Clock recovery 110; and an RX receiver circuitry 112. The RX Clock recovery circuitry 110 extracts a clock signal from a received data stream through strobe DQS 130, and comprises a Voltage Controlled Delay Line (VCDL) and a Phase Interpolator (PI). The Matched Filter 108 operates such that a delay on a data signals DQ 128 matches at least a minimum delay of the strobe DQS 130. The RX 112 extracts Data from the data output of the Matched Filter 108, e.g., using a clock from the RX clock recovery circuitry 110. The RX 112 comprises a DFF, in an example. The Memory interface 150 comprises an RX receiver 120, which is coupled to a Clock Distributor 122, and receives data via connection 116. The Memory interface 150 also comprises Transmitters 124 and 126, which transmit data output DQ 128 and strobe output DQS 130, respectively. The Memory/Controller interface 100 may be analog intensive with circuits that rely on bias currents, and therefore are difficult for power management.

Furthermore, the matched receiver circuitry 114 does not scale well, since it is area and power hungry.

Figure 2:
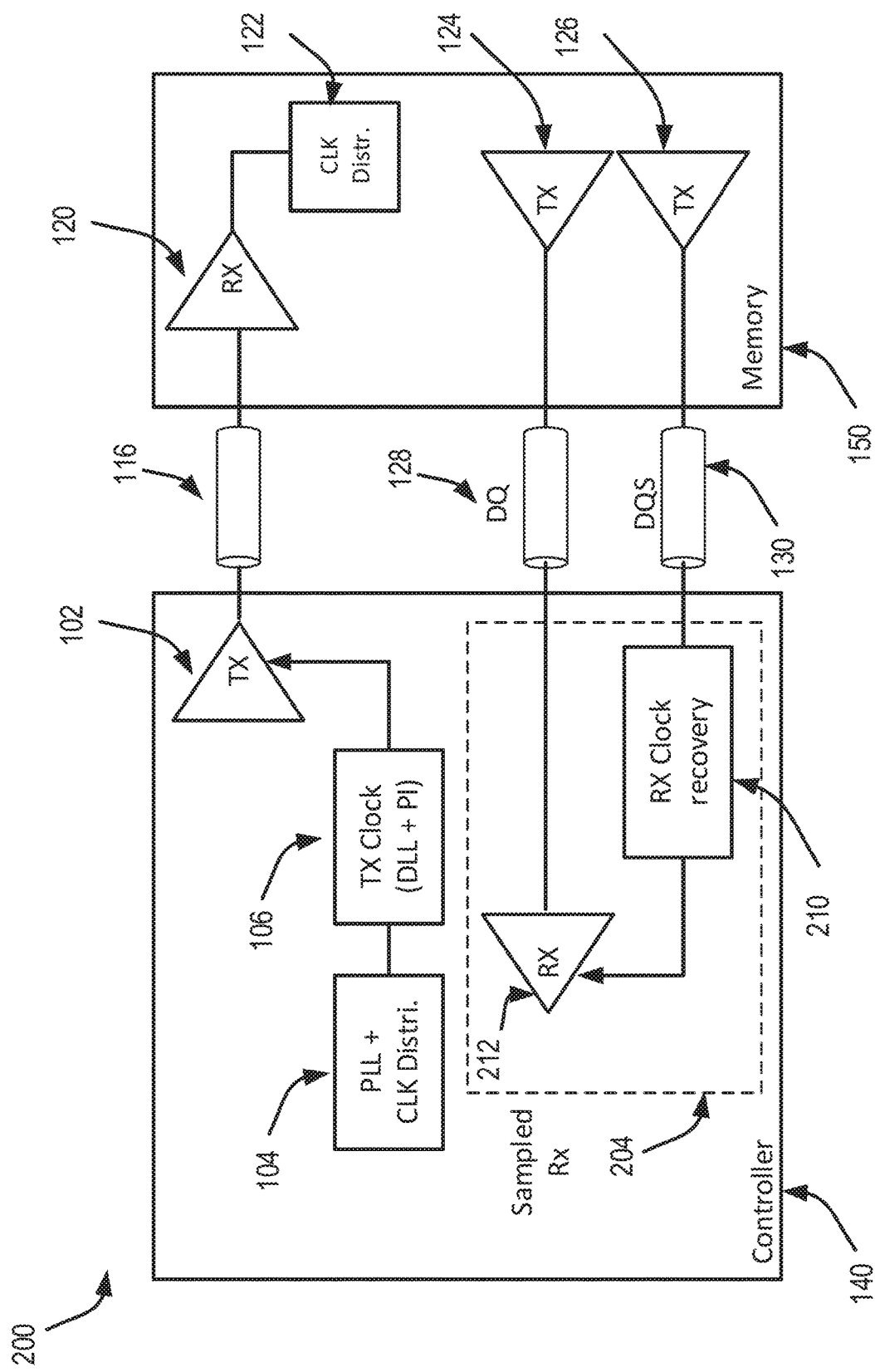
FIG. 2 illustrates a schematic of a Memory/Controller interface comprising a low power Sampled Receiver, according to some embodiments of the current disclosure.

FIG. 2 illustrates a schematic of a Memory/Controller interface 200 comprising a low power Sampled Receiver 204, according to some embodiments. In some embodiments, the Sampled Receiver 204 comprises an RX receiver circuitry 212, and an Rx Clock recovery circuitry 210. The Rx Clock recovery circuitry 210 extracts a clock signal from a received data output strobe DQS 130, and comprises a VCDL and a PI. For example, the VCDL adds a variable amount of sample delay to its input signal. For example, the VCDL receives the data output strobe DQS 130, and adjusts a phase of a sampling clock of the data output strobe DQS 130. The PI allows the Rx Clock recovery circuitry 210 to adjust the phase of the sampling clock in relatively fine increments. Thus, the Rx Clock recovery circuitry 210 adjusts a phase of the sampling clock of the data output strobe DQS 130.

In some embodiments, the Sampled Receiver 204 receives data stream from the output of the memory circuitry 150 via data out DQ 128, and the RX receiver 212 extracts the transmitted data from the data stream received via data output DQ 128, e.g., using the phase adjusted sampling clock (e.g., where the phase is adjusted by the RX Clock recovery circuitry 210) of the data output strobe DQS 130. The RX receiver circuitry 212 does not use any front-end amplification and matched filtering, e.g., unlike FIG. 1. In some embodiments, the RX receiver 212 comprises a sampling receiver with Sample and Hold, Integrator, and strong arm Latch (although these components are not illustrated in FIG. 2, and will be discussed in further details herein later). In some embodiments, the RX receiver 212 comprises one or more of Decision Feedback Equalizers (DFE) and offset Cancellation circuitry (although these components are not illustrated in FIG. 2, and will be discussed in further details herein later).

Figure 3:
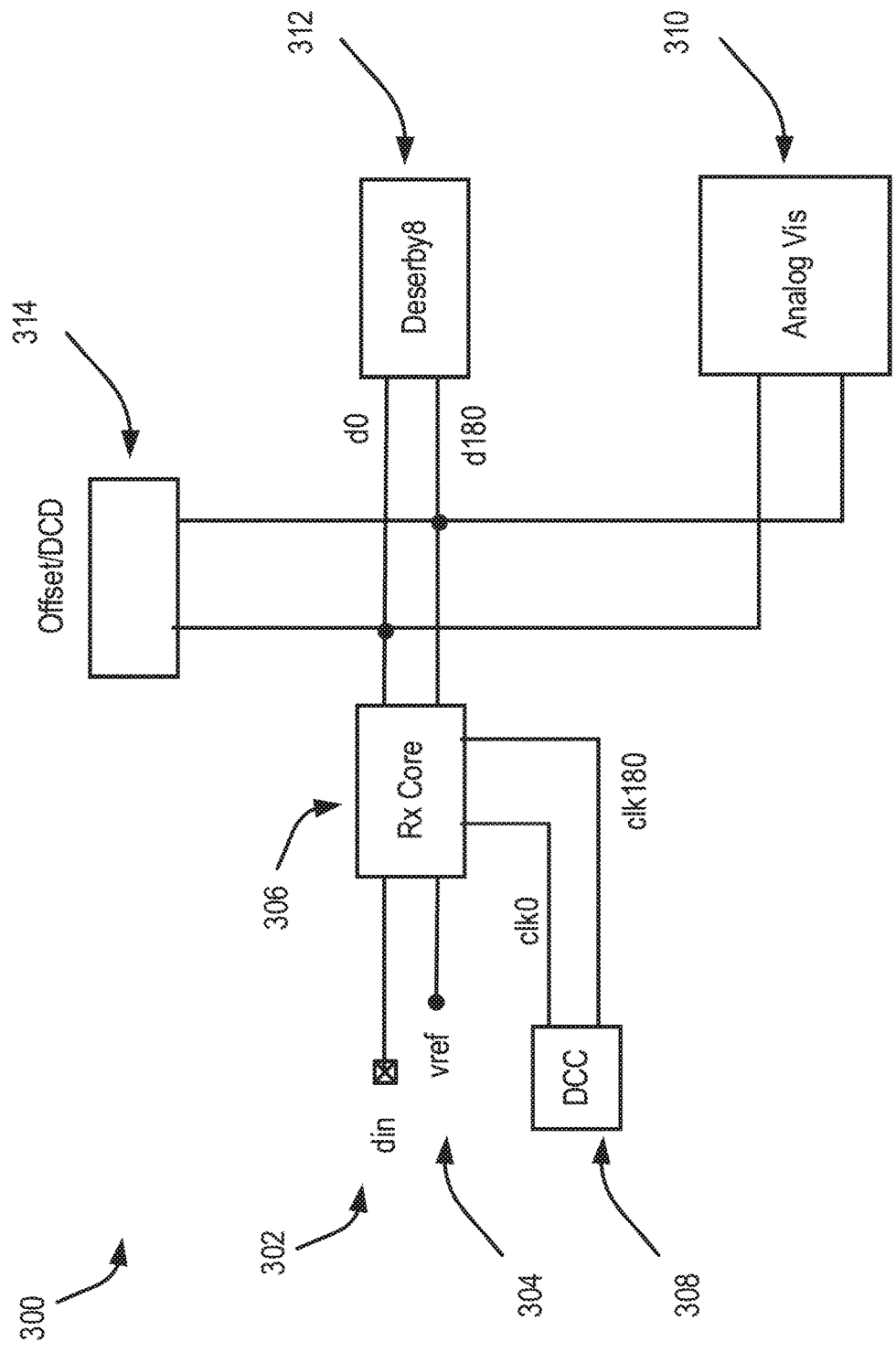
FIG. 3 illustrates a schematic of an example implementation of a Receiver (RX) architecture.

FIG. 3 illustrates a schematic of an example implementation of a Receiver architecture 300A, which may be used for the RX circuitry 212. The architecture 300A comprises an Rx core circuitry 306, an offset/DCD (Duty Cycle Distortion) circuitry 314, DCC (Duty Cycle Correction) circuitry 308, an Analog Vis circuitry 310, and a de-serializer-by-8 (Deserby8) circuitry 312. Analog visibility is a design test feature circuitry to monitor internal signals. The Deserby8 312 circuitry comprises a de-serializer-by-8 circuitry. The DCC 308 circuitry provides clock inputs to the Rx core circuitry 306. The clock inputs comprise of a zero phase clk0 and a rotated 180 phase clk180. Input data (din) 302 and reference voltage (vref) 304 comprise inputs to the Rx core circuitry 306.

Figure 4:
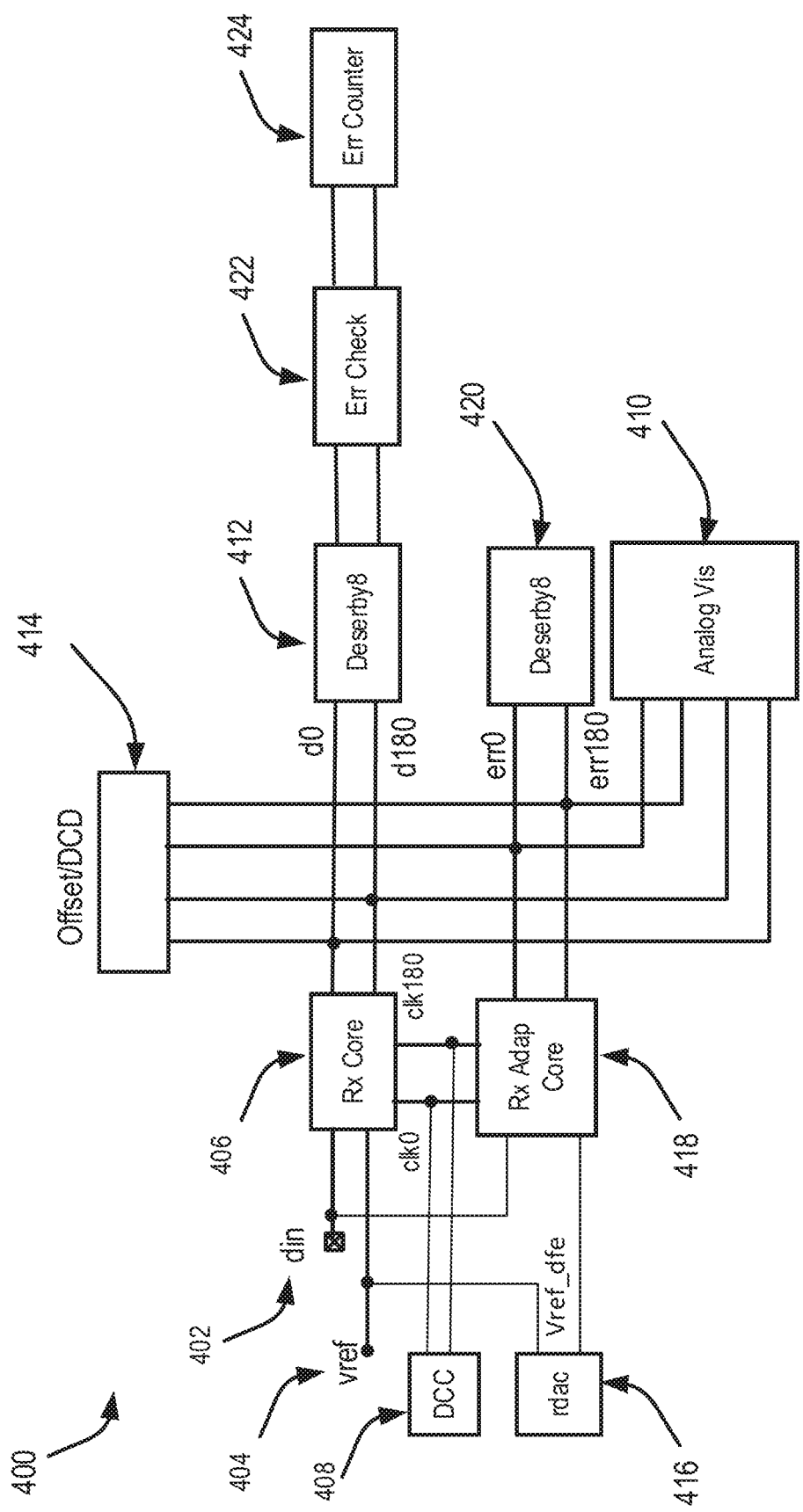
FIG. 4 illustrates a schematic of a Sampled Receiver architecture, according to some embodiments.

FIG. 4 illustrates a schematic of a Sampled Receiver architecture 400 (also referred to as architecture 400), according to some embodiments. In some embodiments, the architecture 400 corresponds to the RX circuitry 212, as shown in FIG. 2. In some embodiments, the architecture 400 comprises an RX core circuitry 406, an offset/DCD (Duty Cycle Distortion) circuitry 414, and a DCC circuitry 408, an Analog Vis circuitry 410, and a Deserby8 circuitry 412. In some embodiments, the DCC circuitry 408 provides clock inputs to the RX core circuitry 406. In some embodiments, the clock inputs from the DCC circuitry 408 comprise half rate clocks clk0 and clk180. In some embodiments, the architecture 400 further comprises an Rx Adaptive Core 418, a RDAC circuitry 416, a second Deserby8 circuitry 420, an Error check circuitry 422 and an Error count circuitry 424. The Error check circuitry 422 detects errors in the data output of the Deserby8. The Error counter 424 circuitry counts a number of errors detected by the Error check circuitry 422. An input data (din) 402 and a reference voltage (vref) 404 comprise inputs to the Rx core circuitry 406. The RDAC circuitry 416 is a resistor digital to analog converter, providing analog reference from a digital code.

FIGS. 5A-5C illustrate a schematic of RX Core configurations, according to some embodiments. FIG. 5A illustrates a RX Core 306a configuration, where the RX Core 306a is an example implementation of the RX Core circuitry 306 of FIG. 3. The RX Core 306a comprises a Sample and Hold (SAH) circuitry 502, an Integrator (INT) circuitry 504, a Latch circuitry 506, and a Set/Reset Latch (SR) circuitry 508, coupled in series. An input data Din and a common-mode reference Vcm are sampled through the SAH circuitry 502.

FIG. 5B illustrates an RX Core 406b, configuration according to some embodiments. The RX Core 406b is an example implementation of the RX Core circuitry 406 of FIG. 4.

The RX Core 406b comprises a Sample and Hold (SAH) circuitry (also referred to as a sampler circuitry, or a sampling circuitry) 502, which receives data Din and common mode voltage Vcm. The input data Din and the common-mode reference Vcm are sampled through the sample and hold circuitry (SAH) 502. The Sample and Hold (SAH) circuitry 502 generates a first output, which is a sampled version of the input data Din. The Sample and Hold (SAH) circuitry 502 generates a second output, which is a sampled version of the common-mode reference Vcm.

The RX Core 406b comprises an Integrator (INT) 504. The INT 504 integrates the sampled version of the input data Din to generate a first output at a node 501a, and integrates the sampled version of the common-mode reference Vcm to generate a second output at a node 501b. Thus, a first output of the INT 504 is an integration of the sampled data Din, and a second output of the INT 504 is an integration of the sampled common mode voltage Vcm.

The RX Core 406b comprises a Latch circuitry 506 (also referred to as latch 506). In some embodiments, the latch 506 comprises a Strong-Arm latch, or any other appropriate type of latch. In some embodiments, latch 506 comprises a clocked comparator. The latch 506 receives the outputs of the INT 504 from the nodes 501a, 501b, and provides a first and a second output to a Set/Reset Latch (SR) circuitry (also referred to as SR latch) 508 of the RX Core 406b. As illustrated in FIG. 5B, the SAH 502, INT 504, latch 506, and the SR latch 508 are coupled in series.

In some embodiments, the RX Core 406b also comprises an offset cancellation circuitry (also referred to as offset circuitry) 510. The offset circuitry 510 adjusts and/or cancels a phase offset based on two inputs Coarse and Fine. For example, outputs of the offset circuitry 510 are coupled to the nodes 501a, 501b. The Coarse and Fine inputs are two control signals provided by the digital logic to correct for offset and DFE code updates, e.g., as needed for the receiver.

In some embodiments, the RX Core 406b receives single-ended input Din, with the common mode voltage Vcm. The INT 504 outputs an integrated version of differential signal pair, where the integrated version of the differential signal pair is based on the single ended data Din and the common mode voltage Vcm (operation of the INT 504 block is discussed in further details with respect to FIG. 9). The INT 504 outputs the differential pair signals at nodes 501a, 501b.

In an example, there may be variations due to process, voltage, temperature, random variations, etc., occurring to various signals in the RX Core 406b, due to which the signals at the nodes 501a, 501b may be offset relative to their intended or actual (e.g., correct) values. The offset circuitry 510 may adjust the differential pair signals at nodes 501a, 501b, to counter such random variations and offsets. For example, the offset circuitry 510 transmits offset signals (not labelled in FIG. 5B) to the nodes 501a, 501b, where the offset signals adjust the pair of differential signals output by the INT 504 at the nodes 501a, 501b.

For example, the offset circuitry 510 may be trained or calibrated offline (e.g., when the RX Core 406b is not used to receive actual data Din). During such training or calibration phase, the data Din and common mode voltage Vcm are set to known reference voltages (e.g., such that Din and Vcm are substantially equal), and the Coarse and Fine control signals of the offset circuitry 510 are incrementally varied, e.g., until the latch 506 detects a change in data value Din and starts detecting a correct value of data Din. The coarse input enables larger and/or faster adjustments of the offset circuitry 510, whereas the fine input enables smaller and/or slower adjustments of the offset circuitry 510. Ideally, the coarse and fine inputs should be zero, e.g., assuming no offset in the RX core 406b. However, in reality, due to inherent or possible offsets, the coarse and fine inputs may be non-zero. Once the offset circuitry 510 is trained and calibrated, the offset circuitry 510 is used to reduce or cancel such offsets, e.g., such that the RX Core 406b is able to detect the data Din correctly. The training of the offset circuitry 510 may occur at periodic or aperiodic intervals, during boot-up process, after resumption of the RX Core 406b from a low power mode, after a detection of temperature change, and/or the like. Thus, the Coarse and Fine inputs of the offset circuitry 510 control an amount of offset correction, and Coarse and Fine inputs of the offset circuitry 510 may be calibrated during the above discussed training or calibration phase.

In some embodiments and as discussed herein above (and also discussed with respect to FIG. 9), the INT 504 outputs an integrated version of differential signal pair, where the integrated version of the differential signal pair is based on the single ended data Din and the common mode voltage Vcm. The differential pair of signals at nodes 501a, 501b are corrected for offset by the offset circuitry 510. The latch 506 receives the differential pair of signals, and outputs a differential pair of output, where the differential pair of output is indicative of an amplified version of the Data Din. As discussed above, the latch 506 comprises a Strong-Arm latch, or any other appropriate type of latch. In an example, the latch 506 comprises a latch having differential pair of inputs and differential pair of outputs.

The output of the latch 506 is sampled by the SR latch 508, which outputs Dp and Dn. Thus, the output Dp and Dn are differential output pair, which are an amplified version of the single ended data input Din.

FIG. 5C illustrates an RX Core 406c configuration, according to some embodiments. The RX Core 406c is an example implementation of the RX Core circuitry 406 of FIG. 4. The RX Core 406c is at least in part similar to the RX Core 406b of FIG. 5B (similar components in FIGS. 5B-5C are marked using same labels), and discussions with respect to the RX Core 406b of FIG. 5B also applies to the RX Core 406c of FIG. 5C. For example, similar to FIG. 5B, the RX Core 406c comprises the SAH circuitry 502, the INT 504, the Latch 506, and the SR latch 508, coupled in series.

In some embodiments, the RX Core 406c comprises the offset circuitry 510, coupled to the nodes 501a, 501b. The offset circuitry 510 adjusts and/or cancels possible offset, based on two inputs Course and Fine, e.g., as discussed with respect to FIG. 5C. The Course input is used by offset circuitry 150 to make larger and/or faster adjustments, and the Fine input is used by offset circuitry 150 for smaller and/or slower adjustments.

In some embodiments (and unlike the RX Core 406f of FIG. 5B), the RX Core 406c comprises a DFE (Decision Feedback Equalizer) circuitry (also referred to as DFE) 512. In some embodiments, the DFE 512 comprises a Course input and a Fine input. In some embodiments, the DFE 512 comprises a Dn input and a Dp input, wherein Dn and Dp are outputs of SR latch 508. Thus, the signals Dn and Dp are feedback from the SR latch 508 to the DFE 512.

In some embodiments, the DFE 512 cancels effects of Inter Symbol Interference (ISI) in the input of the latch 506. ISI is a form of distortion of a signal in which one symbol interferes with subsequent symbols. This is an unwanted phenomenon as the previous symbols have similar effect as noise, thus making the communication less reliable.

In some embodiments, the DFE 512 receives feedback of output Dp and Dn from the SR latch 508. While the latch 506 is to process $N^{th}$ bit, the output Dp and Dn may be indicative of $(N-1)^{th}$. Thus, the DFE 512 receives feedback on past data from the SR latch 508, and sets it's DFE taps, e.g., such that effects of ISI due to past data bits are reduced or cancelled for the current $N^{th}$ data bit. The DFE 512 receives Coarse and Fine inputs, which determine a strength of the equalization performed by the DFE 512. Thus, the feedback of the output Dp and Dn may set a sign of equalization (e.g., whether positive or negative equalization is to be performed), and the Coarse and Fine inputs set a strength of the equalization performed by the DFE 512. For example, the DFE 512 transmits equalization signals (not labelled in FIG. 5B) to the nodes 501a, 501b, where the equalization signals adjust the pair of differential signals output by the INT 504 at the nodes 501a, 501b.

In some embodiments, outputs of each of the offset cancellation circuitry 510 and DFE 512 are coupled to nodes 501a, 501b. Thus, the Latch circuitry 506 receives input from the Integrator circuitry 504, input from the offset cancellation circuitry 510, and input from the Decision Feedback Equalizer circuitry 512 (e.g., a combination of all these inputs).

Figure 6:
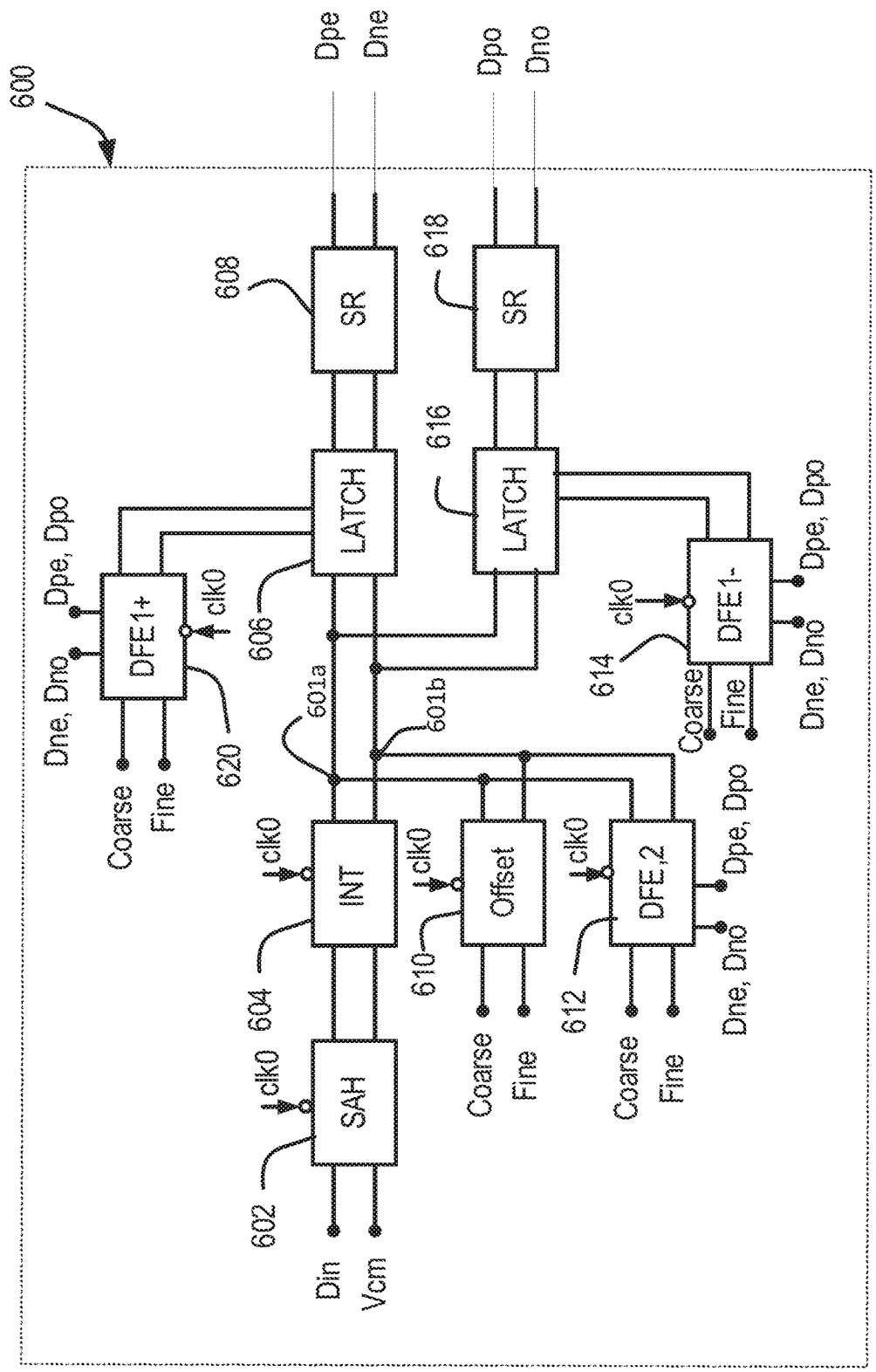
FIG. 6 illustrates a schematic of an RX Core with Adaptive Core architecture, according to some embodiments.

FIG. 6 illustrates a schematic of an Rx Core with Adaptive Core architecture 600 (also referred to as architecture 600), according to some embodiments. The architecture 600 is an example implementation of the RX Adaptive Core 418 of FIG. 4, or is an example implementation of a combination of the RX core circuitry 406 and the RX Adaptive Core 418.

The front-end architecture 600 of FIG. 6 is at least in part similar to the RX Core 406c of FIG. 5C. For example, similar to the RX Core 406c of FIG. 5C, the architecture 600 comprises a SAH circuitry 602, an INT 604, a latch 606, and a Set/Reset Latch circuitry 608 (also referred to as SR latch 608). In some embodiments, the single-ended input signal Din and the common-mode reference Vcm are sampled through the SAH 602. The INT 604 integrates the output of the SAH 602, and outputs differential pair of signals at nodes 601a, 601b. Nodes 601a and 601b are between the latch 606 and the INT 604. In some embodiments, latch 616 and SR latch 618 are also coupled to the nodes 601a, 601b. Similar to FIG. 5C, in the example architecture 600, offset cancellation circuitry 610 and DFE 612 are coupled to the nodes 601a, 601b.

The SAH circuitry 602, INT 604 and offset cancellation circuitry 610 of the architecture 600 are configured and/or operated at least in part similar to respectively the corresponding components of FIG. 5C—hence, these components will not be discussed in further details herein.

In FIG. 6, there are two pair of latches—latch 606 and 616. In some embodiments, the architecture 600 of FIG. 6 is a dual data rate architecture, where data signal Din is present in raising and failing edges of the clock signal of the architecture 600. The latch 606, for example, latches and identifies even bits of the data Din; and the latch 616, for example, latches and identifies odd bits of the data Din (although the opposite may also be true).

Thus, the latch 606 outputs Dpe, Dne, e.g., differential pair of signals identifying even data bits; and the latch 616 outputs Dpo, Dno, e.g., differential pair of signals identifying odd data bits.

The DFE 612 may receive both the differential pair of outputs Dpe, Dne, and Dpo, Dno. For example, if the latch 606 is to receive a $10^{th}$ data bit (merely as an example) of the single ended data Din, the output Dpo, Dno may be differential pair of signals indicative of a $9^{th}$ data bit; and the output Dpe, Dne may be differential pair of signals indicative of a $8^{th}$ data bit. The DFE 612 may use either, or both, the differential pair of outputs Dpe, Dne, and Dpo, Dno to perform equalization operation on the current $10^{th}$ data bit of the data Din.

In some embodiments, the architecture 600 also includes DFEs 620, 614. For example, the DFE 620 may equalize data within the latch 606 (or received by the latch 606), and the DFE 614 may equalize data within the latch 616 (or received by the latch 616).

In some embodiments, the DFEs 620, 614 may operate at least in part similar to the operation of the DFE 612 (e.g., at least in part similar to the operation of the 512 of FIG. 5C).

In some embodiments, the DFE 620 may take advantage of the fact that the latch 606 is detecting even bits. For example, if the ISI correction by the DFE 620 is based merely on a last bit, the DFE 620 may receive the immediate last odd bit, and perform the equalization. Similarly, if the ISI correction by the DFE 614 is based merely on a last bit, the DFE 614 may receive the immediate last even bit, and perform the equalization.

However, in some other embodiments, each of the DFEs 620, 614 may receive both the differential pair of outputs Dpe, Dne, and Dpo, Dno, and perform equalization based on one or more past odd bits and/or one or more past even bits of data Din.

Although FIG. 6 illustrates the DFEs 612, 614, 620 operating based on receiving output of the SR latches 608 and/or 618, in some examples, the DFEs 612, 614, 620 may operate based on receiving output of the latches 606 and/or 616.

As the output of the SR latches 608 and 618 are based on the output of the latches 606 and 616, respectively, the DFEs 612, 614, 620 operate based on the output of the latches 606 and/or 616 (e.g., irrespective of whether the DFEs 612, 614, 620 receive output of the latches 606 and/or 616, or receive output of the SR latches 608 and/or 618).

Although various embodiments, examples and figures of this disclosure discuss DFEs, any appropriate equalization circuitry may be used instead of (or in addition to) the DFEs for cancelling or reducing ISI.

Figure 7A:
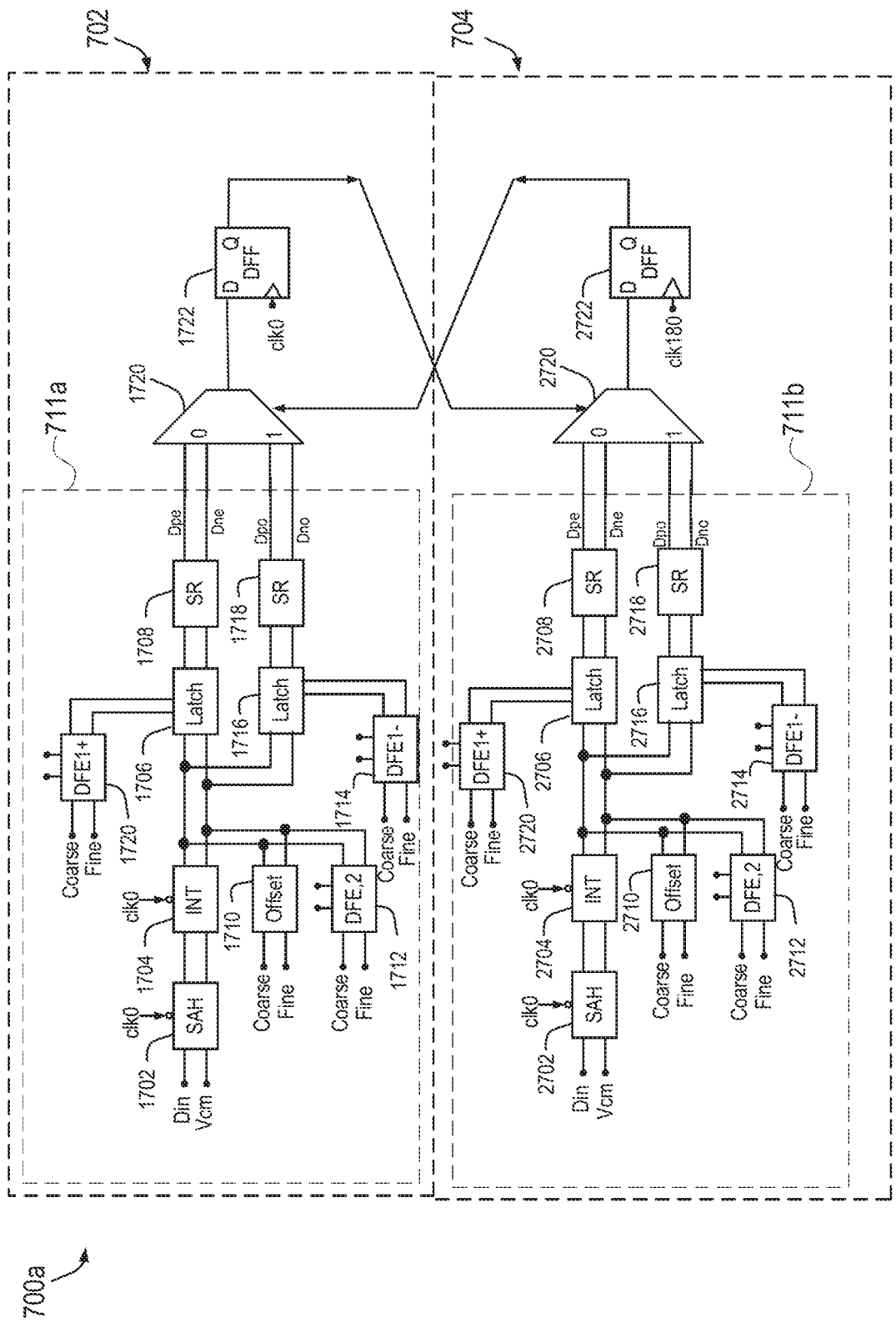
FIG. 7A illustrates a schematic of a Sampled RX architecture including multiplexers, according to some embodiments.

FIG. 7A illustrates a schematic of a Sampled RX architecture 700a (also referred to as architecture 700a) including multiplexers, according to some embodiments. The architecture 700 is an example implementation of the RX Adaptive Core 418 of FIG. 4, or is an example implementation of a combination of the RX core circuitry 406 and the RX Adaptive Core 418.

In some embodiments, the Sampled RX architecture 700a comprises a first Rx Core with Adaptive Core circuitry 702 (also referred to as circuitry 702) cross-coupled with a second Rx Core with Adaptive Core circuitry 704 (also referred to as circuitry 704). The coupling between the Adaptive Core circuitries 702, 704 may be via MUX (Multiplexer) 1720, MUX 2720, DFF 1722 and DFF 2722.

The cross-coupling via the MUX 1720 and 2720 enables the Sampled RX architecture 700a (also referred to as architecture 700a) to operate in any of at least three modes of operation. In some embodiments, a first mode of operation comprises a no-DFE mode. In the first mode of operation, the circuitry 700a operates with offset cancellation only, and the DEFs of the circuitry 700a are non-operational (or may even be absent).

In some embodiments, a second mode of operation comprises a Non-loop DFE mode. In the second mode of operation, the parallel MUX 2720 is not used, and the data passes through the zero path of MUX 1720.

In some embodiments, a third mode of operation comprises a Loop unrolled mode. In the third mode of operation both MUX 1720 and MUX 2720 are used, and data passes through both parallel paths.

In some embodiments the three modes provide re-configurability for different data rates (e.g. 6.4, 8.5, 10 Gbps data rates) and various channels, e.g., depending on the platforms and products where the architecture 700a is used.

Some elements of the first Rx Core with Adaptive Core circuitry 702 are shown within a dotted box 711a, and elements within the dotted box 711a are at least in part similar to the corresponding components of the architecture 600 of FIG. 6. For example, the first Rx Core with Adaptive Core circuitry 702 comprises (e.g., within the dotted box 711a) a SAH 1702, INT 1704, latch circuitries 1706 and 1716, SR circuitries 1708 and 1718, offset cancellation circuitry 1710, and DFE circuitries 1712, 1720, 1714, arrangement and/or functions of which have been discussed with respect to FIG. 6. The inputs to the DFE circuitries 1712, 1720, 1714 are not illustrated in FIG. 7A. However, as discussed with respect to FIG. 6, each of the DFE circuitries 1712, 1720, 1714 may receive one or more of (e.g., all of) both the differential pair of outputs Dpe, Dne, and Dpo, Dno from the SR latches 1708, 1718.

Referring again to FIG. 7A, in some embodiments, the single ended input signal Din and the common-mode reference Vcm is sampled through the SAH 1702 enabling the use of strong-arm latch in a pseudo differential mode. In some embodiments, the offset cancellation 1710 and the DFE taps 1712 are added at the integrator 1704 output. In some embodiments, the DFE loop unrolled taps 1714 and 1720 are summed at the input of each latch 1706 and 1716 with their own self-offset cancellation.

Some elements of the second Rx Core with Adaptive Core circuitry 704 are shown within a dotted box 711b, and elements within the dotted box 711b are at least in part similar to the corresponding components of the architecture 600 of FIG. 6. For example, the second Rx Core with Adaptive Core circuitry 704 comprises a SAH 2702, INT 2704, latch circuitries 2706 and 2716, SR circuitries 2708 and 2718, offset cancellation circuitry 2710, and DFE circuitries 2712, 2720, 2714, arrangement and/or functions of which have been discussed with respect to FIG. 6. The inputs to the DFE circuitries 2712, 2720, 2714 are not illustrated in FIG. 7A. However, as discussed with respect to FIG. 6, each of the DFE circuitries 2712, 2720, 2714 may receive one or more of (e.g., all of) both the differential pair of outputs Dpe, Dne, and Dpo, Dno from the SR latches 2708, 2718.

Referring again to FIG. 7A, in some embodiments, in the second Rx Core with Adaptive Core circuitry 704, the single-ended input signal Din and the common-mode reference Vcm are sampled through the SAH 2702, e.g., thereby enabling the use of strong-arm latch in a pseudo differential mode. In some embodiments, the offset cancellation 2710 and the DFE taps 2712 are added at the INT 2704 output. In some embodiments, the DFE loop unrolled taps 2714 and 2720 are summed at the input of each latch 2706 and 2716 with their own self-offset cancellation.

In some embodiments, the architecture 700a is a loop-unrolling architecture. For example, in a loop-unrolling architecture, the DFE 1712 (e.g., although the principles apply to other DFEs of the architecture 700a as well) may not know quick enough if the immediate previous bit is a zero or one. For example, when a $10^{th}$ bit of data Din is to be processed by the latch 1706, the SR 1718 is still outputting or yet to output a decision on the $9^{th}$ bit. Thus, when equalizing for the $10^{th}$ bit, the DFE 1712 may not yet know if the $9^{th}$ bit is a logical 0 or 1. However, knowing whether the $9^{th}$ bit is a logical 0 or 1 is useful for cancellation of ISI for the $10^{th}$ bit.

Hence, to resolve the ambiguity regarding a value of the previous bit in resolving ISI for the current bit, the loop-unrolling architecture 700a is used. In the loop-unrolling architecture 700a, the circuitry 702 may proceed with an assumption that the immediate previous bit (e.g., for purposes of ISI cancellation by the DFEs 1720, 1712, 1714) is a, for example, zero. On the other hand, the circuitry 704 may proceed with an assumption that the immediate previous bit (e.g., for purposes of ISI cancellation by the DFEs 2720, 2712, 2714) is a, for example, one. Thus, a first branch (e.g., circuitry 702) predicts a zero, and a second branch (e.g., circuitry 704) predicts a one for the immediate previous bit, e.g., while equalizing the current bit. Thus, at least one of the branches (e.g., the branch that correctly predicts the previous bit) is to correctly estimate the current bit. When the previous bit is eventually known, e.g., if the previous bit was correctly predicted by the circuitry 702, the estimation of the circuitry 702 is kept and the estimation of the circuitry 704 is discarded.

Thus, say the $10^{th}$ bit is to be currently estimated, and it is not yet known whether the $9^{th}$ bit is a zero or a 1. Circuitry 702 will assume that the $9^{th}$ bit is a zero, and the DFEs 1712, 1714, and 1720 will perform equalization, e.g., to correct ISI, based on assuming that the $9^{th}$ bit is zero, and the latch 1708 will output Dpe, Dne indicative of the $10^{th}$ bit. Circuitry 704 will assume that the $9^{th}$ bit is a one, and the DFEs 2712, 2714, and 2720 will perform equalization, e.g., to correct ISI, based on assuming that the $9^{th}$ bit is one, and the latch 2708 will output Dpe, Dne indicative of the $10^{th}$ bit.

Now, say, after some time (e.g., while evaluation the $11^{th}$ bit), the decision of the $9^{th}$ bit is completed, and it is determined that the $9^{th}$ bit is actually zero. Then, the ISI performed by the circuitry 702 is correct, and hence, the output Dpe, Dpe from the SR latches 1708 of the circuitry 702 will be used, and the output Dpe, Dpe from the SR latches 2708 of the circuitry 704 will be discarded. Thus, the loop-unrolling architecture 700a helps in fast processing of data (e.g., at Gigahertz levels, merely as an example), and helps cancellation of ISI even though value of a previous bit estimation is not known yet.

Figure 7B:
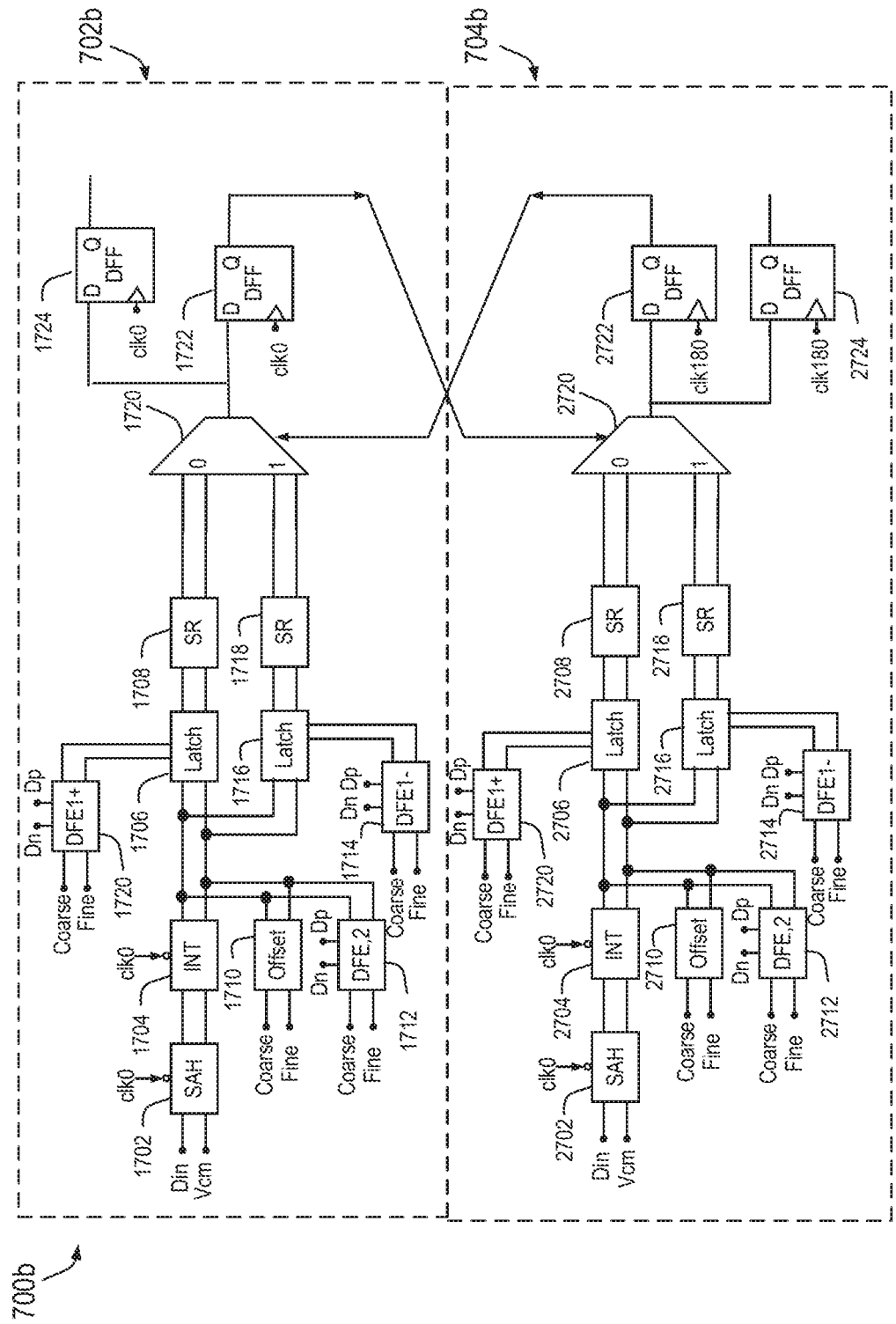
FIG. 7B illustrates a schematic of a Sampled RX architecture, according to some alternative embodiments.

FIG. 7B illustrates a schematic of a Sampled RX architecture 700b, according to some embodiments. The architecture 700b is an example implementation of the RX Adaptive Core 418 of FIG. 4, or is an example implementation of a combination of the RX core circuitry 406 and the RX Adaptive Core 418.

The Sample RX Architecture 700b is at least in part similar to Sampled RX Architecture 700a. However, unlike the Sampled RX Architecture 700a, the Sampled RX Architecture 700b comprises additional output D-type Flip Flops: DFF 1724 and DFF 2724. In some embodiments, the Sampled RX architecture 700b comprises a first Rx Core with Adaptive Core circuitry 702b cross coupled with a second Rx Core with Adaptive Core circuitry 704b (e.g., similar to the Sample RX Architecture 700b), e.g., via MUX 1720, MUX 2720, DFF 1722, DFF 1724, DFF 2722, and DFF 2724. The DFF circuitries sample the outputs of the MUX circuits, which generates the recovered received data. The flip-flops (e.g., D type flop flop) 1724, 2724 may output the estimated data bits.

Figure 8:
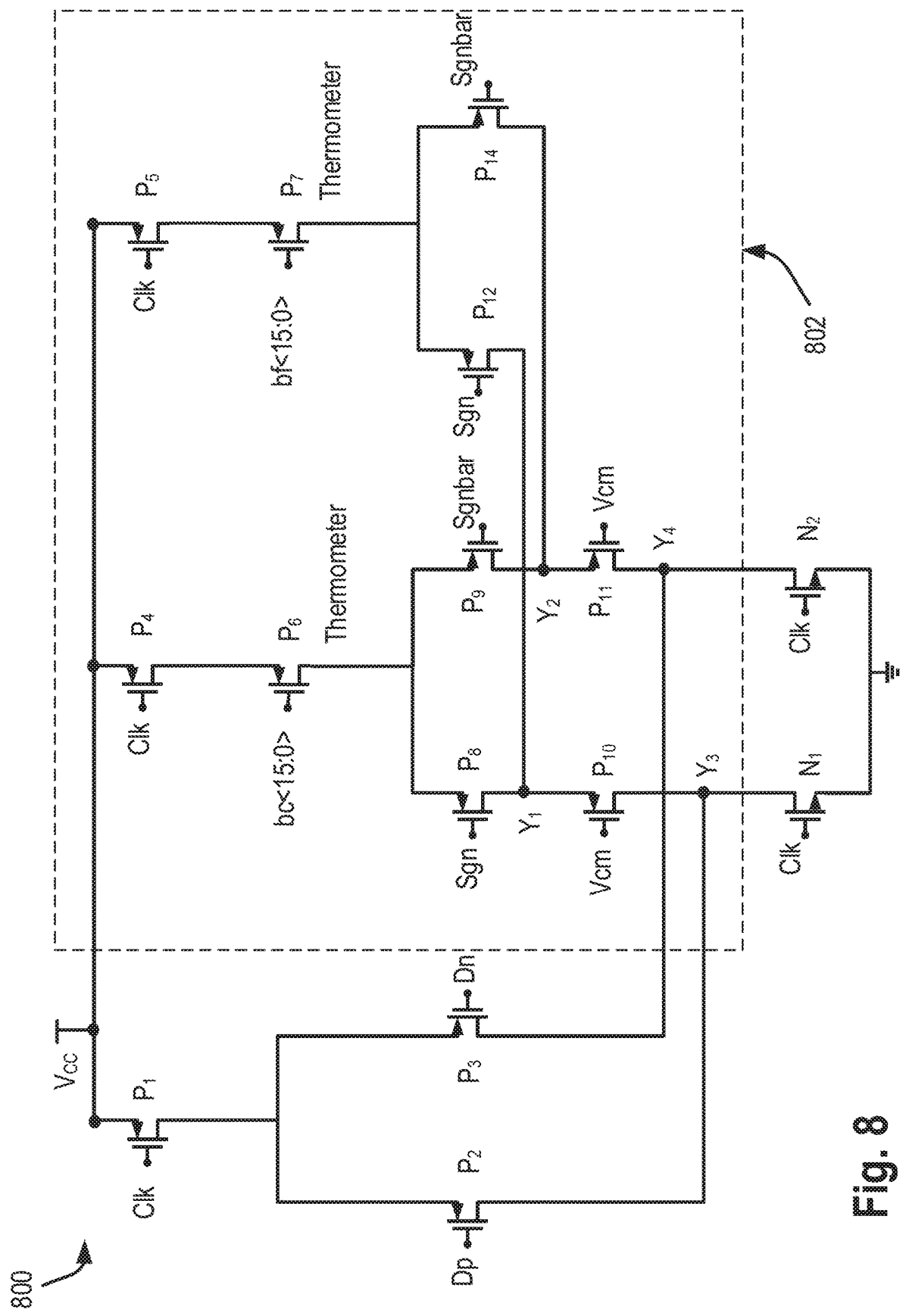
FIG. 8 illustrates an offset cancellation circuitry, according to some embodiments.

FIG. 8 illustrates an offset cancellation circuitry 800 (also referred to as circuitry 800), according to some embodiments.

Specifically, in an example, components within dotted box 802 of the circuitry 800 is used to implement an offset circuitry. In some embodiments, the components within the dotted box 802 of the circuitry 800 are used to implement any of: the offset circuitry 510 of FIG. 5C, the offset circuitry 610 of FIG. 6, or the offset circuitry 1710 of any of FIGS. 7A, 7B.

In some embodiments, the circuitry 800 comprises a first stage pair of P-type transistors, $P_2$ and $P_3$. The transistors $P_2$ and $P_3$ are coupled in series to P-type transistor $P_1$, which is coupled to the supply voltage $V_{CC}$. Thus, the transistors $P_2$, $P_3$ can be turned off by the transistor P1.

In some embodiments gate terminals of transistors $P_2$ and $P_3$ are respectively coupled to the output data Dp and Dn. The input gate terminal of $P_1$ is coupled to the clock signal Clk.

In some embodiments, the circuitry 800 further comprises a second stage pair of P-type transistors, $P_8$ and $P_9$. The transistor pair $P_8$ and $P_9$ are coupled to a P-type transistor $P_6$, which is coupled in series to a P-type transistor $P_4$. The transistor $P_4$ is coupled between the transistor P6 and a supply voltage $V_{CC}$.

In some embodiments, the transistors $P_8$ and $P_9$ are respectively coupled to the transistors $P_{10}$ and $P_{11}$ via common nodes $Y_2$ and $Y_2$, respectively. In some embodiments, the first stage pair of transistors $P_2$ and $P_3$ are coupled to transistor pair $P_{10}$ and $P_{11}$ via common nodes $Y_3$ and $Y_4$. In some embodiments, the transistor pair $P_{10}$ and $P_{11}$ are also coupled to N-type transistor $N_1$ and $N_2$ via common nodes $Y_3$ and $Y_4$.

In some embodiments, the circuitry 800 further comprises a third stage pair of P-type transistors, $P_{12}$ and $P_{14}$. The transistor pair $P_{12}$ and $P_{14}$ are coupled to P-type transistor P7, which is coupled in series to P-type transistor $P_5$. The transistor $P_5$ is coupled to the supply voltage $V_{CC}$. In some embodiments, the transistor pair $P_{12}$ and $P_{14}$ are coupled to transistor pair $P_8$ and $P_9$ via common nodes $Y_1$ and $Y_2$.

In some embodiments, the gate terminals of transistors $P_8$ and $P_9$, and transistors $P_{12}$ and $P_{14}$ are coupled to inputs Sgn and Sgnbar. The inputs Sgn and Sgnbar control positive or negative offset and DFE coefficients. For example, Sgn=1 and Sgnbar=0 results in a positive coefficient, and Sgn=0 and Sgnbar=1 results in a negative coefficient. The gate terminals of transistors $P_{10}$ and $P_{11}$ are coupled to a common-mode reference Vcm. The gate terminals of each of transistors $N_1, N_2, P_1, P_4$ and $P_5$ is coupled to clock signal Clk. In some embodiments, the gate terminals of transistor $P_6$ is coupled to a coarse code bc<15:0>, and the gate terminal of transistor $P_7$ is coupled to a fine code bf<15:0>. In some embodiments, the transistors $P_6$ and $P_7$ function as Thermometers.

Since the gate terminals of transistors $N_1$, $N_2$, $P_1$, $P_4$ and $P_5$ are coupled to clock signal Clk, if the clock signal Clk is not present, none of the transistors in circuitry 800 will operate, and therefore the circuit 800 will consume very low power, e.g., substantially zero power (e.g., will no consume any power). This presents significant power savings compared to conventional receiver circuitry where presence of bias circuitry results in higher power consumption even if clock signal is not present.

Figure 9:
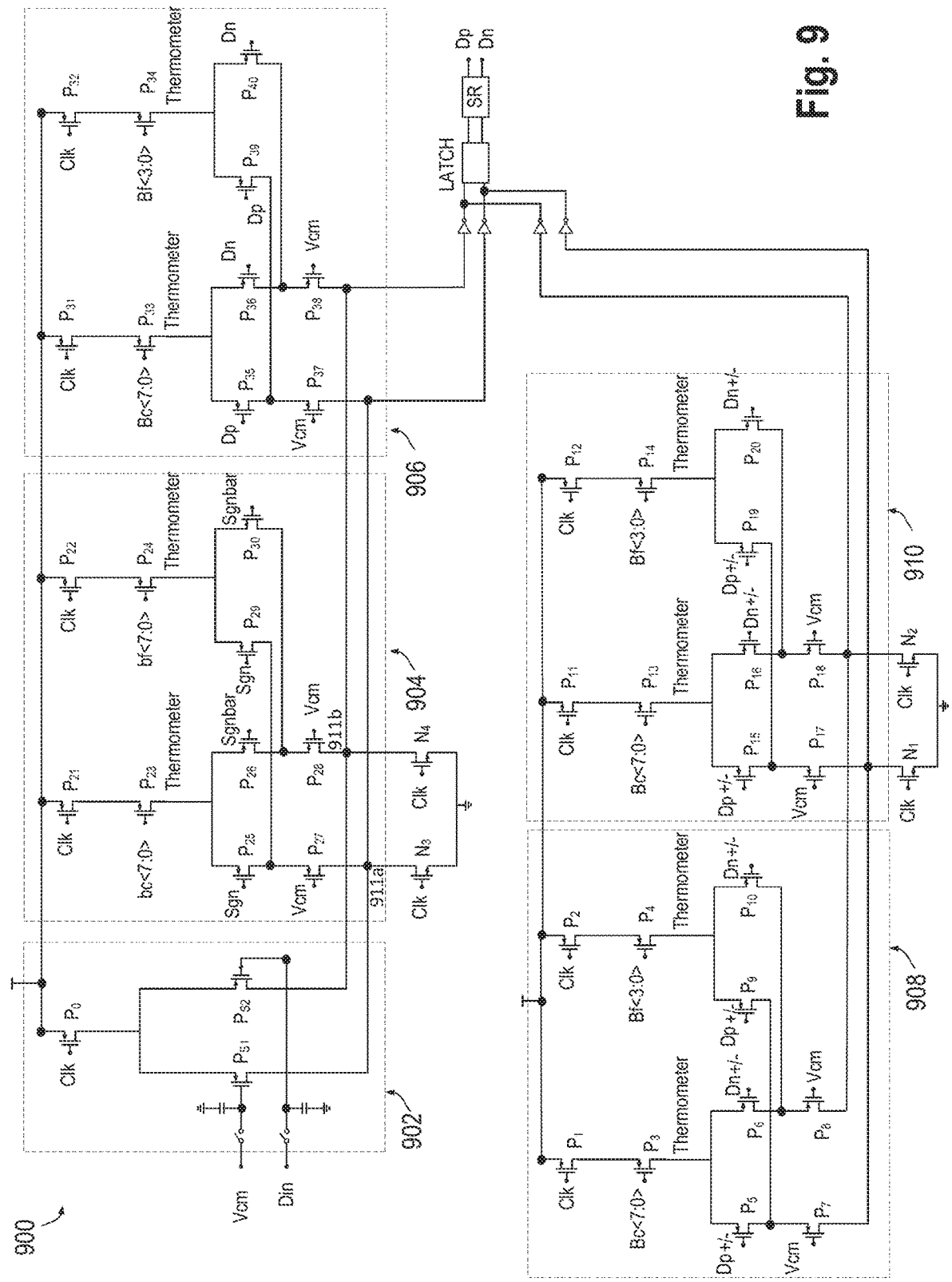
FIG. 9 illustrates circuitry of Front-end Sample-and-Hold (SAH) and offset cancellation, according to some embodiments.

FIG. 9 illustrates circuitry 900 of Front-end SAH and offset cancellation, according to some embodiments. In an example, sections of the circuitry 900 may be used to implement any of the circuitries discussed with respect to, for example, FIG. 5B, 5C, 6, 7A, or 7B.

In some embodiments, the circuitry 900 comprises a section 902 which may comprise a SAH circuitry (e.g., switches and capacitors), e.g., any of the SAH circuitries discussed with respect to FIG. 5B, 5C, 6, 7A, or 7B. The section 902 further comprises an integrator circuitry comprising the transistor pairs $P_{S1}$ and $P_{S2}$. The integrator circuitry is the INT discussed with respect to FIGS. 5A-5C, 6, 7A, and/or 7B. As seen, the transistor pairs $P_{S1}$ and $P_{S2}$ receive sampled version of the data Din and the common mode voltage Vcm, and outputs different pair of signals at nodes 911a, 911b, where the different pair of signals at nodes 911a, 911b are indicative of the data Din.

The circuitry 900 comprises sections 904, 906, 908, and 910. The section 904 represents an offset cancellation circuitry, similar to the section 802 of the circuitry 800 of FIG. 8. The offset cancellation circuitry section 904 may correspond to any offset cancellation circuitry discussed here, such as offset cancellation circuitries discussed with respect to FIGS. 5A-5C, 6, 7A, and/or 7B.

In some embodiments, section 906 represents a DFE cancellation circuitry, e.g., similar to DFE circuitry 612 in FIG. 6 or DFE circuitries 1712 and 2712 in FIGS. 7A, 7B.

In some embodiments, sections 908 and 910 represent a DFE circuitry. For example, section 908 representing the DFE circuitry may be similar to DFE circuitry 614 of FIG. 6, or DFE circuitries 1714 or 2714 of FIG. 7A, 7B. For example, section 908 representing the DFE circuitry may be similar to DFE circuitry 620 in FIG. 6, or DFE circuitries 1720 or 2720 of FIG. 7A, 7B.

Also illustrated are latch 951 (e.g., a Strong arm Latch) and a SR latch 952. The latch 951 and the SR latch 952 can correspond to any of the latch and SR latch of any of FIGS. 5A, 5B, 6, 7A, and/or 7B.

Referring again to FIGS. 5B-5B, it is noted that the components SAH 502, INT 504, offset circuitry 510, DFE circuitry 512, etc. all receive a clock signal Clk. In FIGS. 6, 7A, 7B, one or more of (e.g., each of) the SAH, INT, offset circuitry, DFE circuitries, etc., also receive a clock signal (although the clock to these components are not illustrated in FIGS. 7A-7B for purposes of illustrative clarity). For example, if the clock signal is gated and is off, these components (or at least some of the components) of FIGS. 5B, 5C, 6, 7A, 7B may not operate. The Clock signal is also illustrated in FIGS. 8 and 9, shows as Clk. Thus, these components may be easily turned off by gating the clock signal, e.g., thereby saving power.

Conventional DDRx (where, 'x' is a number) matched receiver (RX) architecture is analog intensive with circuits that rely on bias currents, which are difficult for power management. However, the receiver architecture discussed herein can turned off by gating the clock (e.g., with merely leakage power when the clock is off), thereby saving power compared to the conventional receiver architecture.

Figure 10:
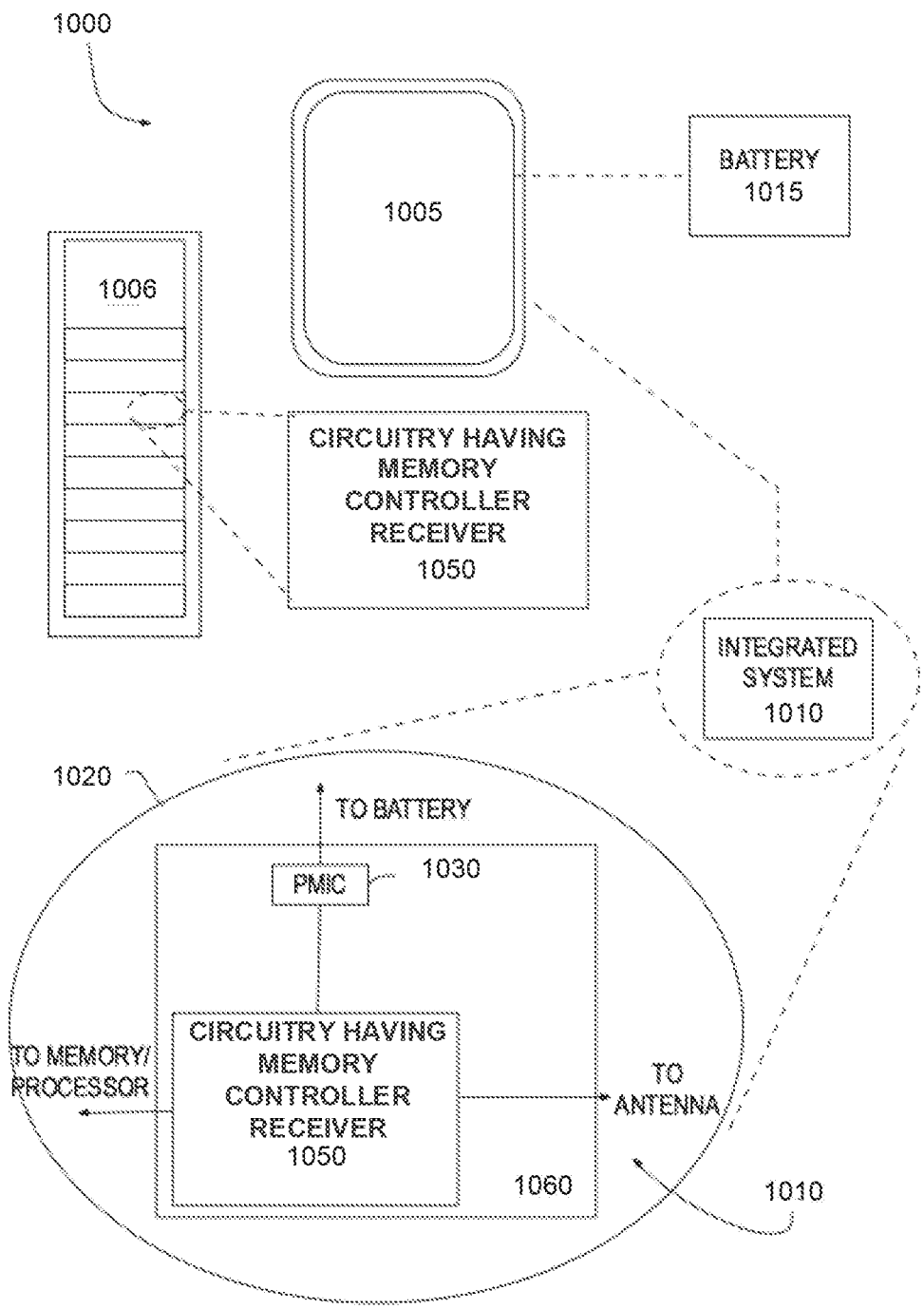
FIG. 10 illustrates a mobile computing platform and a data server machine employing the memory controller receiver, in accordance with some embodiments.

FIG. 10 illustrates a smart device or a computer system or a SoC (System-on-Chip) which includes a memory controller receiver according to some embodiments. FIG. 10 illustrates a system 1000 in which a mobile computing platform 1005 and/or a data server machine 1006 employs circuitry including at least one memory controller receiver, for example in accordance with some embodiments described elsewhere herein. The server machine 1006 may be any commercial server, for example including any number of high-performance computing platforms disposed within a rack and networked together for electronic data processing, which in the exemplary embodiment includes a circuitry 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone discrete or packaged multi-chip module within the server machine 1006, the circuit includes at least one memory controller receiver, for example in accordance with some embodiments described elsewhere herein. Circuitry 1050 may be further attached to a board, a substrate, or an interposer 1060 along with a power management integrated circuit (PMIC). Functionally, PMIC 1030 may perform battery power regulation, DC-to-DC conversion, etc., and so has an input coupled to battery 1015 and with an output providing a current supply to other functional modules.

Circuitry 1050, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one memory controller receiver device, for example in a memory controller receiver circuit as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the disclosure is not limited to the embodiments so described, but can be practiced with modification and alteration without departing from the scope of the appended claims. For example the above embodiments may include specific combinations of features as further provided in examples below.

Figure 11:
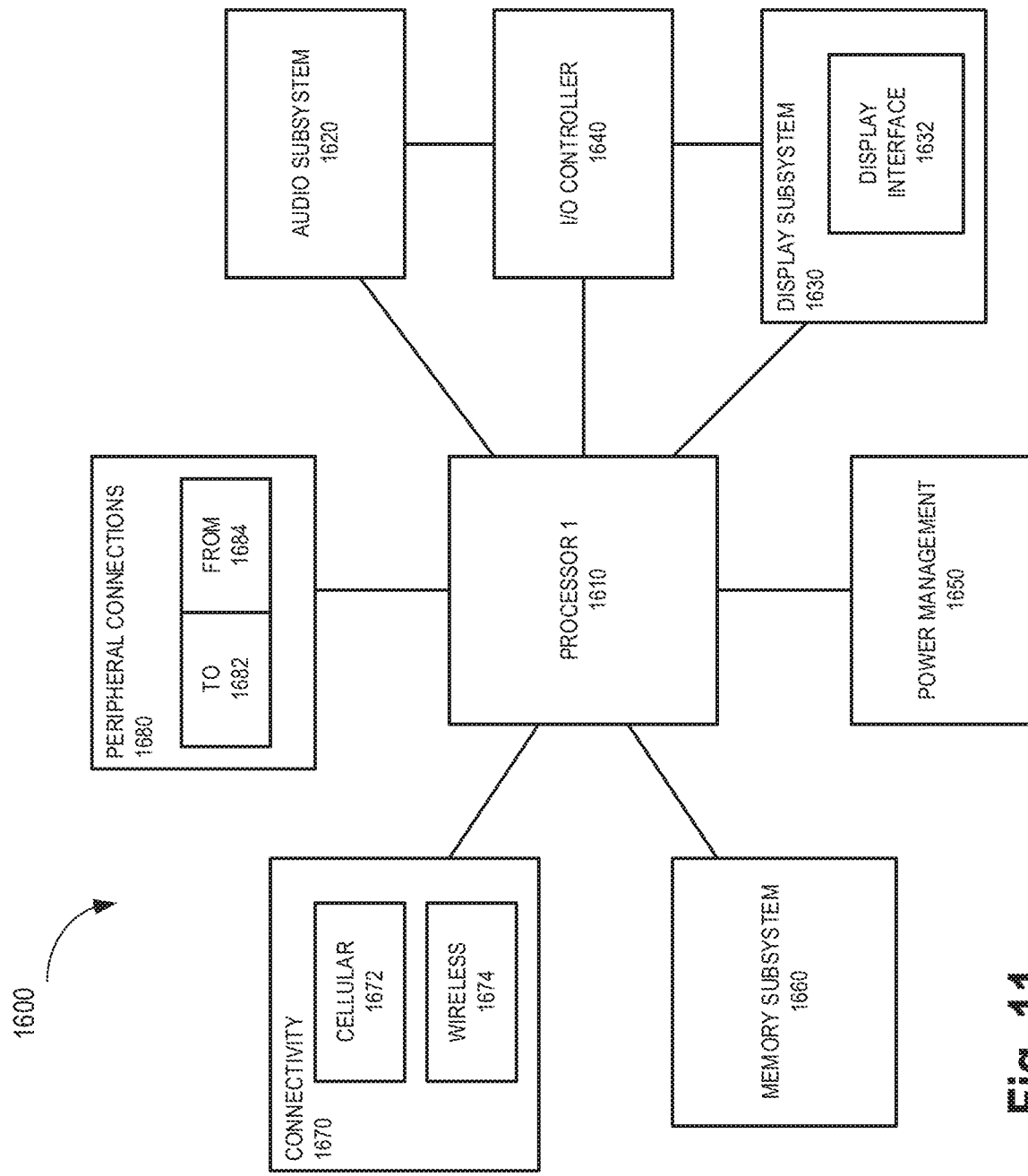
FIG. 11 illustrates a smart device or a computer system or a SoC (System-on-Chip) employing the dual power receiver, according to some embodiments of the disclosure.

FIG. 11 illustrates a smart device or a computer system or a SoC (System-on-Chip) employing a memory controller receiver, according to some embodiments of the disclosure. It is pointed out that those elements of FIG. 11 having the same reference numbers (or names) as the elements of any other figure can operate or function in any manner similar to that described, but are not limited to such.

FIG. 11 illustrates a smart device or a computer system or a SoC (System-on Chip) employing the dual power receiver, according to some embodiments of the disclosure. FIG. 11 illustrates a block diagram of an embodiment of a computing device in which a memory controller receiver could be used, according to some embodiments. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a memory controller receiver, according to some embodiments discussed. Other blocks of the computing device 1600 may also include device 200, memory controller receiver, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

In one example, an apparatus is provided comprising: a first circuitry to sample a first input signal to generate a first sampled signal, and to sample a second input signal to generate a second sampled signal, wherein the first input signal comprises data; a second circuitry to receive the first sampled signal and the second sampled signal, and to generate a first pair of differential signals; an offset cancellation circuitry to cancel or reduce an offset in the first pair of differential signals; and a latch to receive the first pair of differential signals subsequent to the cancellation or reduction of the offset, and to output a second pair of differential signals, wherein the second pair of differential signals is indicative of the data.

Example 2

The apparatus of Example 1, wherein the latch is a first latch, and wherein the apparatus comprises: a second latch to receive the second pair of differential signals, and to generate a third pair of differential signals that is indicative of the data.

Example 3

The apparatus of Examples 1-2, further comprising: a Decision Feedback Equalizer (DFE) circuitry to receive one of the second pair of differential signals from the first latch or the third pair of differential signals from the second latch, and to adjust the first pair of differential signals based on the second or third pair of differential signals.

Example 4

The apparatus of Examples 1-3, wherein the DFE circuitry is to compensate for Inter Symbol Interference (ISI) in the first pair of differential signals.

Example 5

The apparatus of Examples 1-4, wherein the DFE circuitry is to compensate for Inter Symbol Interference (ISI) in a current bit of the first pair of differential signals, based on a value of a previous bit indicated by the second or third pair of differential signals.

Example 6

The apparatus of Examples 1-5, further comprising: a first node and a second node to receive the first pair of differential signals from the second circuitry, offset adjustment signals from the offset cancellation circuitry, and equalization signals from the DFE circuitry.

Example 7

The apparatus of Examples 1-6, wherein: one or more of the second circuitry, the offset cancellation circuitry, and the DFE circuitry is to receive a clock signal; and an off state or clock gated state of the clock signal is to cause the one or more of the second circuitry, the offset cancellation circuitry, and the DFE circuitry to enter a low power state or an off state.

Example 8

The apparatus of Examples 1-7, further comprising: a third latch to receive the first pair of differential signals subsequent to the cancellation or reduction of the offset, and to output a third pair of differential signals, wherein one of the second or third pairs of differential signals is indicative of even bits in the data, and wherein another of the second or third pairs of differential signals is indicative of odd bits in the data.

Example 9

The apparatus of Examples 1-8, wherein the DFE circuitry is a first DFE circuitry, and wherein the apparatus further comprises: a second DFE circuitry to adjust an operation of the first latch, based on one or more of the second or third pair of differential signals; and a third DFE circuitry to adjust an operation of the third latch, based on one or more of the second or third pair of differential signals.

Example 10

The apparatus of Examples 1-9, wherein the DFE circuitry is a first DFE circuitry, and wherein the apparatus further comprises: a second DFE circuitry, wherein the apparatus is to operate in a loop-unroll mode of operation, wherein in the loop-unroll mode of operation and to compensate for Inter Symbol Interference (ISI) in a current data bit, the first DFE is to operate based on a prediction of a first value for a previous data bit, wherein in the loop-unroll mode of operation and to compensate for the ISI in the current data bit, the second DFE is to operate based on a prediction of a second value for the previous data bit, and wherein the previous data bit is to be receive prior to the current data bit.

Example 11

The apparatus of Examples 1-10, wherein the latch is a Strong-Arm latch.

Example 12

The apparatus of Examples 1-11, wherein the second input signal comprises a common mode voltage signal.

Example 13

The apparatus of Examples 1-12, wherein: the offset cancellation circuitry is to, in a calibration phase, calibrate an offset signal; and the offset cancellation circuitry is to use the calibrated offset signal to cancel or reduce the offset in the first pair of differential signals.

Example 14

In one example, a system is provided comprising: a memory to store instructions; a processor to execute the instructions; a wireless interface to facilitate the processor to communicate with another system; and a memory controller to transmit data between the memory and the processor, wherein the memory controller comprises a receiver circuitry comprising: a sample and hold circuitry to sample a single-ended data input and a common mode voltage signal, an integrator circuitry to receive a first output and a second output from the sample and hold circuitry, and to generate a first pair of differential signals, a latch to receive the first pair of differential signals, and to output a second pair of differential signals, and a Decision Feedback Equalizer (DFE) circuitry to receive a third pair of differential signals, and to compensate the first pair of differential signals based on the third pair of differential signals, wherein the third pair of differential signals is based on the second pair of differential signals.

Example 15

The system of Example 14, wherein the latch is a first latch, and wherein receiver circuitry further comprises: a second latch to receive the second pair of differential signals, and to generate the third pair of differential signals.

Example 16

The system of Examples 14-15, wherein: the first latch is a Strong-Arm Latch; and the second latch is a Set/Reset latch.

Example 17

In one example, a receiver circuitry is provided comprising: a first node and a second node to receive a first pair of differential signals that is indicative of data received by the receiver circuitry; an offset cancellation circuitry to cancel or reduce an offset in the first pair of differential signals; an equalization circuitry to compensate the first pair of differential signals, based on a second pair of differential signals output by the receiver circuitry; and a latch to receive the first pair of differential signals subsequent to the cancellation or reduction of the offset and the compensation, and to generate a third pair of differential signals, wherein the second pair of differential signals output by the receiver circuitry is based on the third pair of differential signals output by the latch.

Example 18

The receiver circuitry of Examples 17, wherein the latch is a first latch, and wherein the receiver circuitry further comprises: a second latch to receive the third pair of differential signals, and to output the second pair of differential signals.

Example 19

The receiver circuitry of Examples 17-18, wherein the equalization circuitry is to compensate for Inter Symbol Interference (ISI) in a current bit of the first pair of differential signals, based on a value of a previous bit indicated by the second pair of differential signals.

Example 20

The receiver circuitry of Examples 17-19, wherein the receiver circuitry is to receive the data from a memory interface that is to interface with a memory.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the disclosure should, therefore, be determined with reference to the appended claims, along with the full scope of equivalents to which such claims are entitled.

What is claimed is:

1. An apparatus comprising:
    a first circuitry to sample a first input signal to generate a first sampled signal, and to sample a second input signal to generate a second sampled signal, wherein the first input signal comprises data;
    a second circuitry to receive the first sampled signal and the second sampled signal, and to generate a first pair of differential signals;
    an offset cancellation circuitry to cancel or reduce an offset in the first pair of differential signals;
    a first latch to receive the first pair of differential signals subsequent to the cancellation or reduction of the offset, and to output a second pair of differential signals, wherein the second pair of differential signals is indicative of the data;
    a second latch to receive the second pair of differential signals, and to generate a third pair of differential signals that is indicative of the data; and
    a decision feedback equalizer (DFE) circuitry coupled to the first latch or the second latch.

2. The apparatus of claim 1,
    wherein the DFE circuitry is to receive one of the second pair of differential signals from the first latch or the third pair of differential signals from the second latch, and to adjust the first pair of differential signals based on the second or third pair of differential signals.

3. The apparatus of claim 2, wherein the DFE circuitry is to compensate for Inter Symbol Interference (ISI) in the first pair of differential signals.

4. The apparatus of claim 2, wherein the DFE circuitry is to compensate for Inter Symbol Interference (ISI) in a current bit of the first pair of differential signals, based on a value of a previous bit indicated by the second or third pair of differential signals.

5. The apparatus of claim 2, further comprising:
    a first node and a second node to receive the first pair of differential signals from the second circuitry, offset adjustment signals from the offset cancellation circuitry, and equalization signals from the DFE circuitry.

6. The apparatus of claim 2, wherein:
    one or more of the second circuitry, the offset cancellation circuitry, and the DFE circuitry are to receive a clock signal; and
    an off state or clock gated state of the clock signal is to cause the one or more of the second circuitry, the offset cancellation circuitry, and the DFE circuitry to enter a low power state or an off state.

7. The apparatus of claim 2, further comprising:
    a third latch to receive the first pair of differential signals subsequent to the cancellation or reduction of the offset, and to output a third pair of differential signals,
    wherein a first of the second or third pairs of differential signals is indicative of even bits in the data, and
    wherein a second of the second or third pairs of differential signals is indicative of odd bits in the data.

8. The apparatus of claim 7, wherein the DFE circuitry is a first DFE circuitry, and wherein the apparatus further comprises:
    a second DFE circuitry to adjust an operation of the first latch, based on one or more of the second or third pair of differential signals; and
    a third DFE circuitry to adjust an operation of the third latch, based on one or more of the second or third pair of differential signals.

9. The apparatus of claim 2, wherein the DFE circuitry is a first DFE circuitry, and wherein the apparatus further comprises:
    a second DFE circuitry,
    wherein the apparatus is to operate in a loop-unroll mode of operation,
    wherein in the loop-unroll mode of operation and to compensate for Inter Symbol Interference (ISI) in a current data bit, the first DFE is to operate based on a prediction of a first value for a previous data bit,
    wherein in the loop-unroll mode of operation and to compensate for the ISI in the current data bit, the second DFE is to operate based on a prediction of a second value for the previous data bit, and
    wherein the previous data bit is to be receive prior to the current data bit.

10. The apparatus of claim 1, wherein the latch comprises a Strong-Arm latch.

11. The apparatus of claim 1, wherein the second input signal comprises a common mode voltage signal.

12. The apparatus of claim 1, wherein:
    the offset cancellation circuitry is to, in a calibration phase, calibrate an offset signal; and
    the offset cancellation circuitry is to apply the calibrated offset signal to cancel or reduce the offset in the first pair of differential signals.

13. The apparatus of claim 1, wherein the first circuitry, the second circuitry, the offset cancellation circuitry, the first latch, the second latch, and the DFE circuitry are part of an I/O receiver.

14. A system comprising:
a memory to store instructions;
a processor to execute the instructions;
a wireless interface to facilitate the processor to communicate with another system; and
a memory controller to transmit data between the memory and the processor, wherein the memory controller comprises a receiver circuitry comprising:
- a sample and hold circuitry to sample a single-ended data input and a common mode voltage signal;
- an integrator circuitry to receive a first output and a second output from the sample and hold circuitry, and to generate a first pair of differential signals;
- a latch to receive the first pair of differential signals, and to output a second pair of differential signals; and
- a Decision Feedback Equalizer (DFE) circuitry to receive a third pair of differential signals, and to compensate the first pair of differential signals based on the third pair of differential signals,
wherein the third pair of differential signals is based on the second pair of differential signals.

15. The system of claim 14, wherein the latch is a first latch, and wherein receiver circuitry further comprises:
a second latch to receive the second pair of differential signals, and to generate the third pair of differential signals.

16. The system of claim 15, wherein:
the first latch comprises a Strong-Arm Latch; and
the second latch comprises a Set/Reset latch.

17. A receiver circuitry comprising:
a first node and a second node to receive a first pair of differential signals that is indicative of data received by the receiver circuitry;
an offset cancellation circuitry to cancel or reduce an offset in the first pair of differential signals;
an equalization circuitry to compensate the first pair of differential signals, based on a second pair of differential signals output by the receiver circuitry; and
a latch to receive the first pair of differential signals subsequent to the cancellation or reduction of the offset and the compensation, and to generate a third pair of differential signals,
wherein the second pair of differential signals output by the receiver circuitry is based on the third pair of differential signals output by the latch.

18. The receiver circuitry of claim 17, wherein the latch is a first latch, and wherein the receiver circuitry further comprises:
a second latch to receive the third pair of differential signals, and to output the second pair of differential signals.

19. The receiver circuitry of claim 17, wherein the equalization circuitry is to compensate for Inter Symbol Interference (ISI) in a current bit of the first pair of differential signals, based on a value of a previous bit indicated by the second pair of differential signals.

20. The receiver circuitry of claim 17, wherein the receiver circuitry is to receive the data from a memory interface that is to interface with a memory.

* * * * *